United States Patent
Chwalek et al.

(10) Patent No.: US 11,417,309 B2
(45) Date of Patent: Aug. 16, 2022

(54) ULTRASONIC TRANSDUCER WITH VIA FORMED IN PIEZOELECTRIC ELEMENT AND METHOD OF FABRICATING AN ULTRASONIC TRANSDUCER INCLUDING MILLING A PIEZOELECTRIC SUBSTRATE

(71) Applicant: Ascent Ventures, LLC, Pittsford, NY (US)

(72) Inventors: James M Chwalek, Pittsford, NY (US); Todd A Jackson, Walworth, NY (US)

(73) Assignee: ASCENT VENTURE, LLC., Pittsford, NY (US)

( * ) Notice: Subject to any disclaimer, the term of this patent is extended or adjusted under 35 U.S.C. 154(b) by 145 days.

(21) Appl. No.: 16/204,249

(22) Filed: Nov. 29, 2018

(65) Prior Publication Data
US 2020/0175958 A1    Jun. 4, 2020

(51) Int. Cl.
| | |
|---|---|
| *G01N 29/24* | (2006.01) |
| *G10K 11/32* | (2006.01) |
| *G10K 11/02* | (2006.01) |
| *G01N 29/28* | (2006.01) |
| *G01N 29/04* | (2006.01) |
| *H01L 41/25* | (2013.01) |

(52) U.S. Cl.
CPC ........... *G10K 11/32* (2013.01); *G01N 29/043* (2013.01); *G01N 29/2487* (2013.01); *G01N 29/28* (2013.01); *G10K 11/02* (2013.01); *H01L 41/25* (2013.01)

(58) Field of Classification Search
CPC ... B06B 1/0681; B06B 1/0662; H01L 40/293; H01L 41/297
See application file for complete search history.

(56) References Cited

U.S. PATENT DOCUMENTS

| | | | | | |
|---|---|---|---|---|---|
| 3,394,586 | A | * | 7/1968 | Newbold | G01N 29/28 73/644 |
| 3,688,222 | A | * | 8/1972 | Lieberman | H03H 9/125 29/25.35 |
| 3,893,048 | A | * | 7/1975 | Lieberman | H03H 9/30 310/317 |
| 4,034,317 | A | * | 7/1977 | Uemura | H03H 9/36 333/143 |
| 4,296,349 | A | * | 10/1981 | Nakanishi | G10K 11/28 310/326 |
| 4,546,283 | A | * | 10/1985 | Adamo | H05K 3/245 257/E23.068 |

(Continued)

*Primary Examiner* — Tran M. Tran
(74) *Attorney, Agent, or Firm* — Brown & Michaels, PC

(57) ABSTRACT

An ultrasonic transducer that includes a delay line, an active piezoelectric element, and interposing metal conductive layer between the delay line and active piezoelectric element. The delay line and active piezoelectric element are joined so that ultrasonic waves may be coupled from the active piezoelectric element into the delay line or from the delay line into the active piezoelectric element. A via is formed, using a milling operation, in the active piezoelectric element to expose the edge of the interposing metal conductive layer between the delay line and active piezoelectric element. A conductive layer makes electrical contact between the interposing metal conductive layer and the surface of the active piezoelectric element to allow an electrical connection to be made from the surface of the active piezoelectric element to the interposing metal conductive layer.

18 Claims, 4 Drawing Sheets

(56) References Cited

U.S. PATENT DOCUMENTS

| | | | | |
|---|---|---|---|---|
| 5,045,746 | A * | 9/1991 | Wersing | B06B 1/0648 310/334 |
| 5,078,013 | A * | 1/1992 | Kuramochi | G01H 1/04 73/620 |
| 5,493,541 | A * | 2/1996 | Snyder | B06B 1/0622 310/334 |
| 5,629,578 | A * | 5/1997 | Winzer | B06B 1/0614 257/E27.006 |
| 5,655,276 | A * | 8/1997 | Pattanayak | B06B 1/0629 29/25.35 |
| 5,834,880 | A * | 11/1998 | Venkataramani | B06B 1/064 310/334 |
| 5,855,049 | A * | 1/1999 | Corbett, III | B06B 1/0622 219/121.85 |
| 6,894,425 | B1 * | 5/2005 | Solomon | B06B 1/0629 310/334 |
| 7,148,608 | B2 * | 12/2006 | Baumgartner | B06B 1/0622 310/334 |
| 8,207,652 | B2 * | 6/2012 | Baumgartner | A61B 8/4483 310/334 |
| 8,878,367 | B2 * | 11/2014 | Lin | H01L 23/5225 257/774 |
| 9,473,106 | B2 * | 10/2016 | Wathen | H03H 9/30 |
| 10,357,225 | B2 * | 7/2019 | Rice | B06B 1/0662 |
| 10,396,271 | B2 * | 8/2019 | Matsuda | H01L 41/0805 |
| 10,490,728 | B2 * | 11/2019 | Xia | H01L 41/0474 |
| 10,586,912 | B2 * | 3/2020 | Latev | H01L 41/098 |
| 10,594,294 | B2 * | 3/2020 | Elsherbini | H03H 9/36 |
| 2015/0151330 | A1 * | 6/2015 | Tsuruno | B06B 1/0622 367/7 |
| 2019/0036003 | A1 * | 1/2019 | Xia | H01L 41/29 |
| 2019/0283082 | A1 * | 9/2019 | Hughes | B06B 1/0207 |
| 2020/0282427 | A1 * | 9/2020 | Chaggares | G10K 11/355 |
| 2021/0283656 | A1 * | 9/2021 | Chwalek | H01L 41/312 |

* cited by examiner

ULTRASONIC TRANSDUCER WITH VIA FORMED IN PIEZOELECTRIC ELEMENT AND METHOD OF FABRICATING AN ULTRASONIC TRANSDUCER INCLUDING MILLING A PIEZOELECTRIC SUBSTRATE

BACKGROUND OF THE INVENTION

The invention pertains to the field of transducers for ultrasonic devices. More particularly, the invention pertains to the formation of ultrasonic transducers using a milling operation.

Ultrasonic testing of materials requires an ultrasonic transducer to introduce an ultrasonic stimulus wave into a test material, and for transmitted or reflected ultrasonic waves to be detected and analyzed. The ultrasonic stimulus waves can be either compressive or shear waves. In some applications, two ultrasonic transducers can be used where one transducer introduces the stimulus wave and a second transducer detects reflected or transmitted waves. Alternatively, a single transducer can be used to both introduce the stimulus wave and to detect reflected waves. It is also common for such transducers to employ an acoustic delay line in order to introduce a pre-determined time delay between the stimulus wave and the reflected wave or waves.

FIG. 1 is a cross section of a representative delay line transducer. The delay line 10 is acoustically coupled to an ultrasonic stimulus wave generator such as a piezoelectric element 12. Conductive electrodes 16 and 18 provide a means to apply a stimulus voltage to excite the piezoelectric material. Electrical contact to these electrodes is made through an electrical conductor such as a wire 20 and a means to make an electrical contact from the conductive electrode 16 to an electrically conductive housing 24. Such means, for example, may be a ring of electrically conductive epoxy 22. External electrical connection is made through an appropriate connector 26 mounted on the housing 24 to an appropriate stimulus wave signal generator and reflected or transmitted ultrasonic wave detecting electronics. A backing layer 28 is employed to provide both dampening of the vibrating piezoelectric material as well as to scatter and absorb the backwards traveling wave. Such a dampening layer, properly chosen, can result in a transducer with a short temporal response and high bandwidth resulting in a high resolution device. Such transducers are particularly useful in non-destructive testing and layer thickness metrology. The delay line 10 is typically fabricated using a sufficient thickness of a solid material (based on its' sound velocity) such as various plastics or glasses. Coupling of acoustic energy from the piezoelectric element 12 to this delay line 10 is critical for maintaining the performance sensitivity of the transducer to detect low amplitude ultrasonic waves. For low frequency transducers, the coupling means can simply be through a pressing contact between the transducer and the delay line. To enhance this coupling, and mitigate any surface non-uniformity between the transducer and delay line, a fluid such as water or glycerin can be used as an intermediary. However, as the frequency increases, and the wavelengths decrease, such means are not sufficient to attain high-performance coupling. Often, in this case, a thin adhesive 14 is used to structurally bond the transducer to the delay line.

In the current art, due to the nature of the processes and materials used, high-frequency transducers are typically fabricated in small lots, often as single devices. Such fabrication, while providing functional devices, is sub-optimal from the standpoint of consistency and cost. If such devices could be produced using wafer level processes, similar to the approaches employed in the semiconductor or MEMS industry, then it follows that similar consistency and cost reduction advantages would be obtained. Current wafer-level bonding processes, though quite successful in the semiconductor or MEMS industries, are not well suited to delay line piezoelectric transducers.

FIGS. 2A-2C illustrate the basic fabrication steps of a delay line ultrasonic transducer. In FIG. 2A, a delay line substrate 30 is fabricated from a suitable material. Also shown in FIG. 2A is a thin metal layer 32 vacuum deposited by conventional means, such as sputter deposition, on the substrate. In FIG. 2B, the active transducer element in the form of a piezoelectric substrate 40 is shown. Also shown in FIG. 2B is a thin metal layer 42 deposited with the same material and thickness as the delay line substrate. Alternatively, a single thin metal layer may be deposited on either the delay line substrate 30 or the piezoelectric substrate 40.

Once the thin metal layer or layers are deposited on the substrates, the two wafers may be pressed together to form an atomic diffusion bond. This type of bonding is extremely strong and robust and provides for efficient acoustic energy coupling between the two materials allowing the efficient transfer of ultrasonic waves in both directions. Alternatively, other wafer level bonding techniques could be used such as polymer or adhesive, anodic, metal diffusion, thermo-compression, or eutectic-alloy bonding though each of these suffer from drawbacks as discussed in the aforementioned patent application.

FIG. 2C shows the two substrates 30 and 40 bonded together into a single metal layer 52. If the wafer thickness of the piezoelectric substrate 40 is initially thicker than the required thickness for the desired resonant frequency, the piezoelectric substrate 40 may be thinned to the desired thickness. Once the desired thickness of the piezoelectric substrate 40 is attained, exposure to the bonded metal layer 52, is needed in order to make an electrical connection so as to form one of the two electrodes that will be used to electrically-stimulate the piezoelectric substrate 40. While this exposure of the bonded metal layer 52 may be achieved by a variety of conventional techniques such as that using an appropriate photomask combined with selective etching using reactive gases, ion milling, or a wet chemical etch, these techniques are difficult and expensive to employ for many desirable piezoelectric materials.

For dry etching techniques such as reactive ion etching (RIE) or ion beam milling of materials such as LiNbO3 or PZT, due to the extremely low etch rates, and the thickness of the piezoelectric materials involved, which is typically in the tens of microns, extremely long etch times of many hours are required. This significantly increases manufacturing costs and limits fabrication throughput. In addition, thick metal masks, as opposed to photoresist, need to be used in order to survive the erosive nature of the long etch time. This requires extra processing steps, and consequently also increases manufacturing costs, as the thick metal masks need to be deposited and patterned.

Wet etch processes, while potentially lower cost than dry etch processes, have etch rates which are often crystal orientation dependent and may not be compatible with the required orientation for the particular piezoelectric material chosen. In addition, due to the reactive nature of the chemistry employed, a metal mask is often needed, which as stated previously, can drive up manufacturing cost.

As for either dry or wet etch processes, the selectivity of the etch may be low between the piezoelectric material and the metal making it difficult to etch the piezoelectric material and at the same time ensure enough metal is left behind to make an adequate subsequent electrical contact. Finally, for either dry or wet etch processes, a practical chemistry may simply not exist for the particular piezoelectric material chosen. The need for a simpler, lower manufacturing cost, broad material compatibility based patterning process is evident. The use of conventional mechanical means such as a Computer Numerical Control (CNC) milling machine to accomplish this goal is appealing due to its' low manufacturing cost and broad material compatibility. U.S. Pat. No. 5,257,178 entitled "METHOD OF OPTIMALLY OPERATING A COMPUTER NUMERICAL CONTROL MILLING MACHINE TO MILL OPTIMAL HIGH DENSITY INTERCONNECT SUBSTRATES" and issued Oct. 26, 1993 to Hatfield, et. al., incorporated herein by reference, discloses a method for optimally operating a CNC milling machine to form cavities in a ceramic substrate for receiving IC chips and other components of a high density interconnect structure electrically interconnected by a multi-layer high density interconnect (HDI) structure.

Other mechanical means such as conventional drilling have been disclosed. U.S. Pat. No. 6,221,769 entitled "METHOD FOR INTEGRATED CIRCUIT POWER AND ELECTRICAL CONNECTIONS VIA THROUGH WAFER INTERCONNECTS" and issued Apr. 24, 2001 to Dhong, et. al., incorporated herein by reference, discloses a method for providing a through wafer connection to an integrated circuit silicon package. A hole is first created in the silicon package with an inner surface area extending from the bottom surface of the silicon package to the top surface of the silicon package. The hole is created by one of two methods including mechanical drilling with a diamond bit rotated at a high rate of speed. The inner surface area of the hole is covered with an insulating material to insulate the conductive material which is later deposited and to serve as a diffusion barrier, and then a seed material is placed in the hole. Finally, the hole is filled with a conductive material which is utilized to provide large power inputs or signaling connections to the IC chips.

While such methods utilize mechanical means such as milling or drilling operations to provide pockets or holes in a substrate, they could not be used to form the type of connecting vias needed in the ultrasonic transducer devices disclosed in this application.

SUMMARY OF THE INVENTION

A method is disclosed for producing an ultrasonic transducer including a via allowing external contact with a buried metal layer in the ultrasonic transducer consistent with reproducible performance at a low manufacturing cost across a wide variety of piezoelectric materials. While described embodiments involve an ultrasonic delay-line transducer, using piezoelectric materials, it is recognized that the technique may be applied to other devices and material systems.

In an embodiment, an ultrasonic transducer includes a delay line, a piezoelectric element, an interposing metal conductive layer between the delay line and the piezoelectric element, a via formed by milling in the piezoelectric element and the delay line to expose an edge of the interposing metal conductive layer between the delay line and piezoelectric element, and a conductive layer making electrical contact between the interposing metal conductive layers and a surface of the piezoelectric element to allow an external electrical connection to be made from the surface of the active piezoelectric element to the interposing metal conductive layers, wherein the delay line and the piezoelectric element are configured to couple ultrasonic waves from the piezoelectric element into the delay line or from the delay line into the piezoelectric element.

In another embodiment, a method of producing an ultrasonic transducer includes the steps of providing a delay line substrate, providing a piezoelectric substrate as an active transducer element, depositing a first metal layer on the delay line substrate, depositing a second metal layer on the piezoelectric substrate, or depositing a single metal layer on either the delay line substrate or the piezoelectric substrate, bonding the delay line substrate to the piezoelectric substrate to form a stack and to facilitate coupling ultrasonic waves from the piezoelectric element into the delay line or from the delay line into the piezoelectric element, milling the piezoelectric substrate to expose metal of at least one of the first metal layer and the second metal layer to allow electrical contact, depositing a first patterned electrode on the exposed metal to allow external electrical connection to the at least one of the first metal layer and the second metal layer, and depositing a second patterned electrode on the piezoelectric element, the second patterned electrode defining an active area of the ultrasonic transducer and configured to electrically connect externally.

DETAILED DESCRIPTION OF THE INVENTION

In order to overcome the common issues with current methods of producing a via in piezoelectric materials used in ultrasonic transducers and to provide reproducible performance at a low manufacturing cost across a wide variety of piezoelectric materials, a novel fabrication method is employed.

Figure 3A:
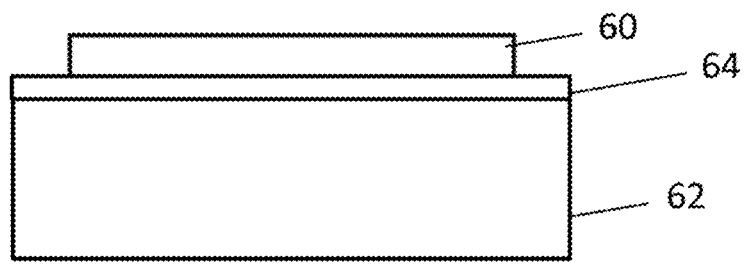
FIG. 3A shows a schematic cross sectional view of a delay line substrate bonded with a piezoelectric substrate, according to an embodiment of the invention.

FIGS. 3A-3G illustrate the basic fabrication steps for creating a via resulting in the ability to make an external contact with the bottom conductive layer in an ultrasonic transducer in accordance with this invention. FIG. 3A shows a cross-sectional view of a piezoelectric substrate 60 bonded to a delay line substrate 62 and interposing bonded metal layers 64. As previously discussed, exposure of the buried bonded metal layers 64 is needed in order to make an electrical connection and form one of the two electrodes that will be used to electrically-stimulate the piezoelectric substrate 60.

Figure 3B:
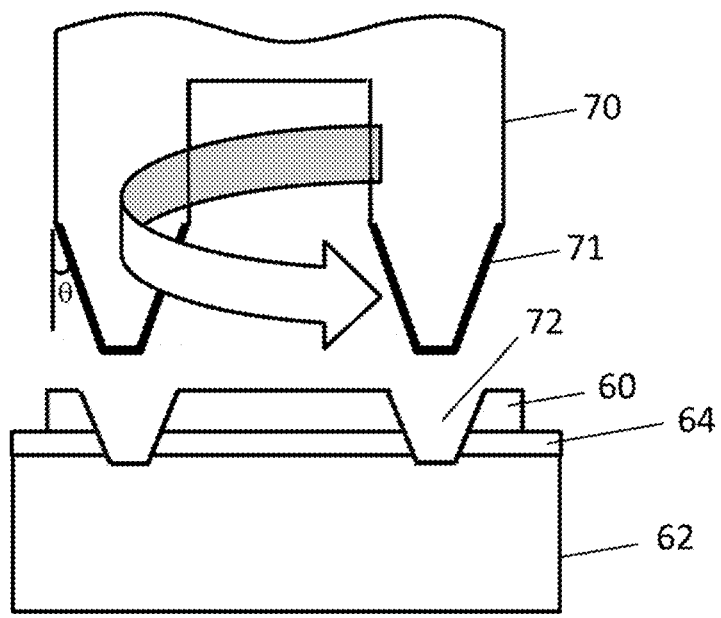
FIG. 3B shows a schematic cross sectional view of a delay line substrate bonded with a piezoelectric substrate, a via with sloped walls, and an annular custom cutting tool used to form the via, according to an embodiment of the invention.

FIG. 3B shows a cross-sectional view of a custom cutting tool 70, which has annular cutting surfaces 71 that may be rotated at a high speed and whose position may be controlled in all three axes by a conventional CNC milling machine. The cutting tool 70 may be made from an appropriate material such as steel, and may be impregnated with a hard coating such as diamond for longevity along the cutting surfaces 71. It is also recognized that the cutting tool 70 can be a single point tool that is moved in a pattern controlled by the CNC machine so that many types of via geometries can be created, such as, a point, a linear trough, or a closed loop such as a square or circle. If an annulus is desired the cutting tool 70 may have an annular cross section (in the plane perpendicular to the one shown in FIG. 3B).

The important aspect of the cutting tool 70 is that the cutting surfaces 71 are angled (shown as the angle $\theta$ in FIG. 3B) to form sloped sidewalls in the bonded piezoelectric substrate 60 and delay line substrate 62 exposing the edge of the bonded metal layers 64. The sloped sidewalls are important so that a subsequent conductive metal layer, that will form an electrode, may be deposited to form a contiguous conductive layer connecting the edge of the exposed bonded metal layers 64 to the surface of the piezoelectric substrate 60 so that an external connection may be easily made. The exact sloping angle of the cutting tool 70 and subsequent via sidewall is not critical but should be such that the formation of a contiguous conductive layer is possible. Too steep or retrograde an angle could result in the formation of non-contiguous conductive layer resulting in the inability to form an external electrical connection with the bonded metal layers 64. This angle may usefully range to be greater than 0 degrees but less than 90 degrees. Such a cutting tool can be made inexpensively by conventional means.

Also shown in FIG. 3B, is the bonded piezoelectric substrate 60 and delay line substrate 62 after the cutting tool 70 has formed a via 72 in the form of an annular ring with sloped sidewalls by the cutting tool 70. The in-plane positioning of where the via 72 is placed may be precisely controlled and repeated in multiple locations by the CNC milling machine.

Figure 3C:
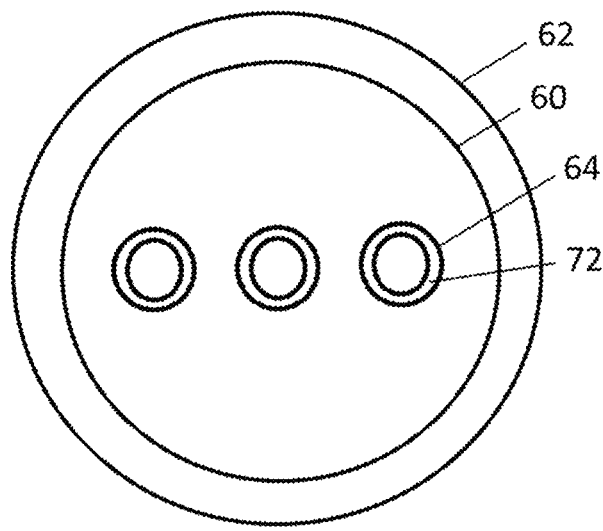
FIG. 3C shows a schematic top view of a plurality of vias formed in a delay line substrate bonded with a piezoelectric substrate, according to an embodiment of the invention.

FIG. 3C shows a top view of several annular vias 72 cut into the bonded piezoelectric substrate 60 and delay line substrate 62. One of the biggest advantages of this technique, adding to the technique's simplicity and low cost, is that the depth of the via 72 need not be precisely controlled as long as the via 72 is deep enough to expose edges of the bonded metal layers 64. In addition, the roughness of the sidewall is not critical in this particular type of ultrasonic transducer as the actual active area of the device, subsequently determined by a patterned conductive layer, can be defined a sufficient distance away from the sloped sidewalls so as not to impact performance. This allows, once programmed, a typical CNC milling machine using the cutting tool 70 to rapidly and inexpensively form any number of such vias 72.

Figure 3D:
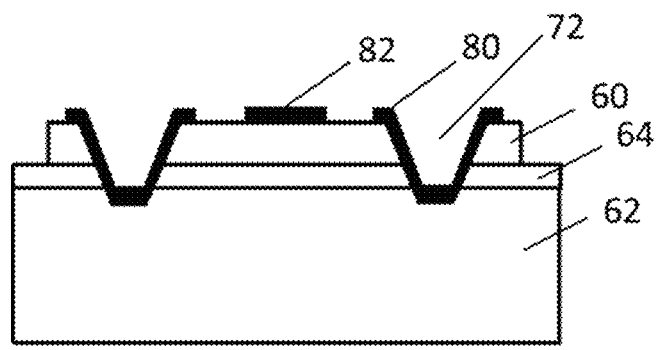
FIG. 3D shows a schematic cross sectional view of a delay line substrate bonded with a piezoelectric substrate and metal electrodes, according to an embodiment of the invention.

Once edges of the bonded metal layers 64 are exposed, a first conductive layer 80, shown in FIG. 3D, preferably a metal, can be deposited by conventional means and patterned using a shadow mask. This first conductive layer 80 will make contact with the edge of the bonded metal layers and continue on to the surface of the piezoelectric substrate 60. The first conductive layer 80, which forms a first electrode, should be patterned to allow external connection of the bonded metal layers 64 without interfering with a second conductive layer 82 that defines the active area of the device and that forms a second electrode providing a convenient means of applying an external voltage to the two electrodes to stimulate the piezoelectric substrate 60.

Figure 3E:
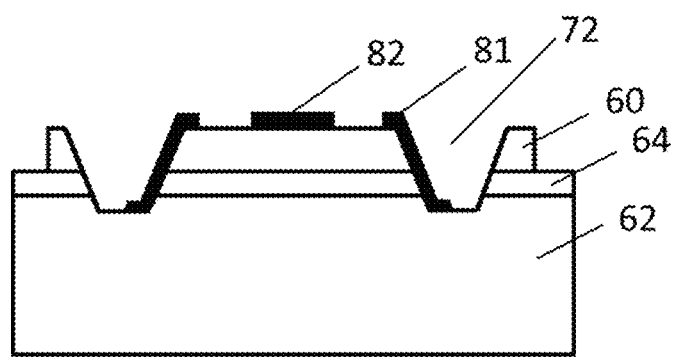
FIG. 3E shows a schematic cross sectional view of a delay line substrate bonded with a piezoelectric substrate and metal electrodes, according to an embodiment of the invention.

Alternatively, as shown in FIG. 3E, an alternative first conductive layer 81 may be patterned to allow contact with the edge of the bonded metal layers only on the radially innermost side of the via 72.

Figure 3F:
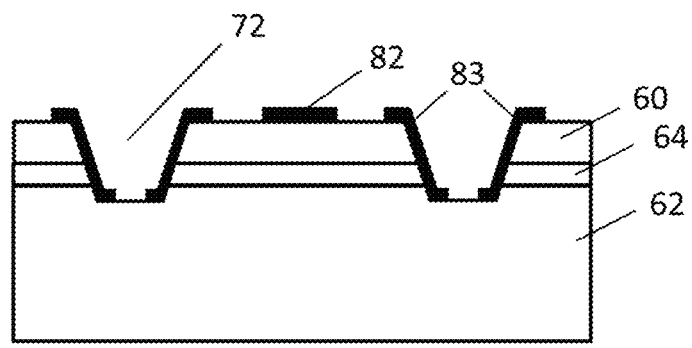
FIG. 3F shows a schematic cross sectional view of a delay line substrate bonded with a piezoelectric substrate and metal electrodes, according to an embodiment of the invention.

In another alternative, as shown in FIG. 3F, a second alternative first conductive layer 83 is provided on both the radially innermost and outermost sides of the via 72, as would be the case for adjacent but electrically independent devices such as in the fabrication of an array. If the same material for any of the electrodes is desired, a single shadow mask may be used along with a single metal deposition to define all of the electrodes.

Figure 1:
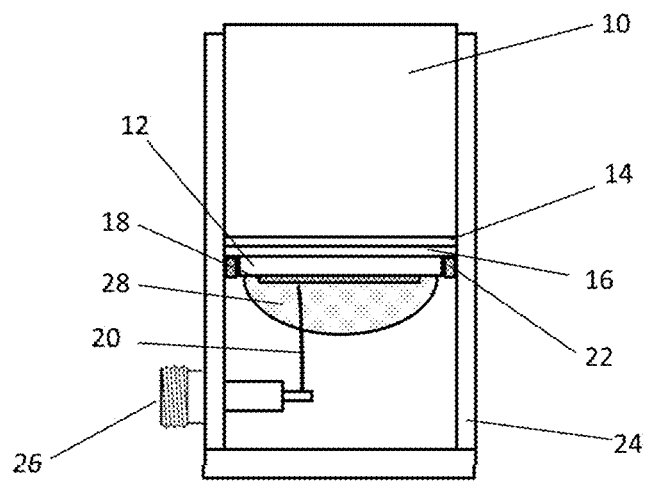
FIG. 1 shows a schematic cross sectional view of an ultrasonic transducer with a delay line according to the prior art.
Figure 2A:
FIG. 2A shows a schematic cross sectional view of a delay line substrate with a thin conductive metal layer, according to the prior art.
Figure 2B:
FIG. 2B shows a schematic cross sectional view of a piezoelectric substrate with a thin conductive metal layer, according to the prior art.
Figure 2C:
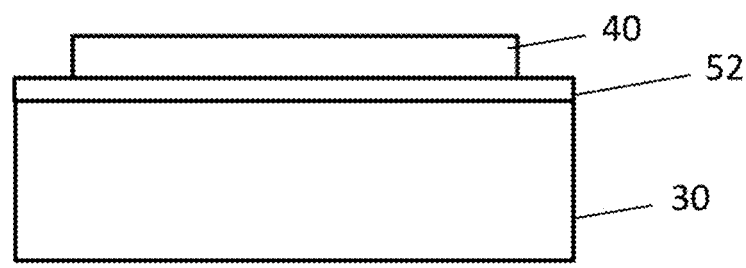
FIG. 2C shows a schematic cross sectional view of a delay line substrate bonded with a piezoelectric substrate, according to the prior art.
Figure 3G:
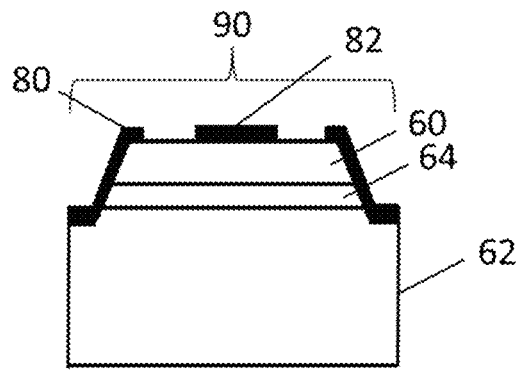
FIG. 3G shows a schematic cross sectional view of an individual device, according to the embodiment of FIG. 3D.

FIG. 3G shows an individual device 90 obtained using conventional core-drilling techniques. If a high bandwidth device is desired, a backing layer such as that discussed in association with FIG. 1 can be added. Typically, an epoxy impregnated with small dense metal particles, such as silver or tungsten is used. Small size (compared to the wavelength of the acoustic waves generated in the transducer) dense metal particles in an epoxy matrix will provide a high acoustic impedance and hence a high degree of damping while scattering, diffusing, and absorbing the backward travelling acoustic wave that is coupled into the material. This can produce a transducer with a short temporal response resulting in a high resolution device.

The individual device 90 may be mounted in an appropriate case and external connection of the first conductive layer 80 and the second conductive layer 82 can be made with any number of conventional means. A proper stimulus voltage, typically in the form of a pulse, may be applied to the two electrodes producing an ultrasonic wave which will propagate from the piezoelectric material into the delay line and may be used to interrogate a given test material that is coupled to the delay line. After the appropriate delay time, a reflected wave from the interrogated test material will propagate back to the piezoelectric material and can be measured with appropriate receiver electronics.

Figure 4:
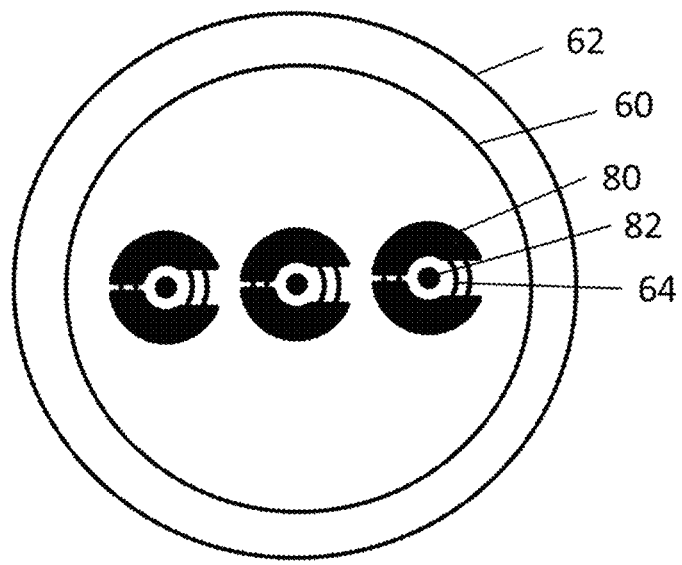
FIG. 4 shows a schematic top view of multiple piezoelectric transducer devices fabricated according to an embodiment of the invention.

As a demonstration of the feasibility of the current invention, an ultrasonic transducer was fabricated according to the steps outlined in this disclosure. FIG. 4 shows a top view illustrating the patterning, through the use of a shadow mask, of the first conductive layer 80 and the second conductive layer 82. Gold was used as the bonded metal layers as well as both the first conductive layer 80 and the second conductive layer 82. Fused silica was chosen as the delay line substrate 62 material and lithium niobate as the piezoelectric substrate 60 material. The fused silica delay line substrate 62 and the lithium niobate piezoelectric substrate 60 were bonded using an atomic diffusion process.

A custom milling tool with cutting edges angled at 45 degrees and an annular cross section with a 5 mm diameter and 2 mm sidewall thickness was used to form an annular via. The first conductive layer 80 is divided into two halves. In this way, the only path of conduction from one half of the first conductive layer 80 to the second half of the first conductive layer 80 is through the contact made by the via through the bottom bonded metal layer 64. A low resistance measurement would confirm the successful contact made through the via providing proof of the concept. A two point resistance measurement was made contacting the upper and lower halves of the first conductive layer 80 on a number of devices. In each case, the resistance was less than 2 ohms, indicating an excellent contact made through the via.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

LIST OF REFERENCE NUMBERS 60 piezoelectric substrate
62 delay line substrate
64 interposing metal layers
70 cutting tool
71 cutting surfaces
72 annular via
80 first conductive layer
81 alternative first conductive layer
82 second conductive layer
83 second alternative first conductive layer
90 individual device

What is claimed is:

1. An ultrasonic transducer comprising:
   a delay line;
   a piezoelectric element;
   an interposing metal conductive layer between the delay line and the piezoelectric element wherein the delay line and the piezoelectric element are configured to couple ultrasonic waves from the piezoelectric element into the delay line or from the delay line into the piezoelectric element;
   a via formed in the piezoelectric element, the interposing metal conductive layer, and the delay line, the via exposing a portion of the interposing metal conductive layer and the delay line, the via having a depth terminating within the delay line; and
   a first patterned electrode making electrical contact between the exposed portion of the interposing metal conductive layer and a surface of the piezoelectric element to allow an external electrical connection to be made from the surface of the active piezoelectric element to the interposing metal conductive layer.

2. The ultrasonic transducer of claim 1, wherein the via tapers to the depth.

3. The ultrasonic transducer of claim 1, wherein the via extends annularly and includes two side walls extending a full depth of the via, and wherein the first patterned electrode is on a radially inward one of the two side walls.

4. The ultrasonic transducer of claim 1, wherein the via extends annularly and includes two side walls extending a full depth of the via, and wherein the first patterned electrode is on both of the two side walls.

5. The ultrasonic transducer of claim 4, wherein the first patterned electrode is discontinuous between the two side walls.

6. The ultrasonic transducer of claim 1, further comprising a second patterned electrode on the piezoelectric element, the second patterned electrode defining an active area of the ultrasonic transducer and configured to electrically connect externally.

7. The ultrasonic transducer of claim 1, wherein the via forms an annular ring in a surface of the piezoelectric element.

8. The ultrasonic transducer of claim 1, wherein the via extends less than entirely through the delay line.

9. A method of producing an ultrasonic transducer, the method comprising the steps of:
   providing a delay line substrate;
   providing a piezoelectric substrate as an active transducer element;
   depositing a first metal layer on the delay line substrate;
   depositing a second metal layer and the piezoelectric substrate;
   bonding the delay line substrate to the piezoelectric substrate to form a stack and to facilitate coupling ultrasonic waves from the piezoelectric element into the delay line or from the delay line into the piezoelectric element;
   milling the piezoelectric substrate to form a via exposing a portion of at least one of the first metal layer and the second metal layer to allow electrical contact, and exposing a portion of the delay line substrate, the via having a depth terminating within the delay line substrate;
   depositing a first patterned electrode on the exposed portion to allow external electrical connection to the at least one of the first metal layer and the second metal layer; and
   depositing a second patterned electrode on the piezoelectric element, the second patterned electrode defining an active area of the ultrasonic transducer and configured to electrically connect externally.

10. The method of claim 9, further comprising:
    milling the piezoelectric substrate at a plurality of locations; and
    partitioning the stack through at least one of the plurality of locations to create individual ultrasonic transducers.

11. The method of claim 10, wherein the partitioning includes core drilling through the delay line substrate of the at least one of the plurality of locations.

12. A method of producing an ultrasonic transducer, the method comprising the steps of:
    providing a delay line substrate;
    providing a piezoelectric substrate as an active transducer element;
    depositing a metal layer on either the delay line substrate or the piezoelectric substrate;
    bonding the delay line substrate to the piezoelectric substrate such that the deposited metal layer is between the delay line substrate and the piezoelectric substrate to form a stack and to facilitate coupling ultrasonic waves from the piezoelectric element into the delay line or from the delay line into the piezoelectric element;

milling the piezoelectric substrate to form a via exposing a portion of at least one of the first metal layer and the second metal layer to allow electrical contact, and exposing a portion of the delay line substrate, the via having a depth terminating within the delay line substrate;

depositing a first patterned electrode on the exposed portion to allow external electrical connection to the at least one of the first metal layer and the second metal layer; and depositing a second patterned electrode on the piezoelectric element, the second patterned electrode defining an active area of the ultrasonic transducer and configured to electrically connect externally.

13. The method of claim 12, wherein milling the piezoelectric substrate occurs at a plurality of locations and the method of claim 10 further comprises partitioning the stack through at least one of the plurality of locations to create individual ultrasonic transducers.

14. The method of claim 13, wherein the partitioning includes core drilling through the delay line substrate of the at least one of the plurality of locations.

15. The method of claim 12, wherein milling the piezoelectric substrate forms the via tapering to the depth.

16. The method of claim 12, wherein milling the piezoelectric substrate forms the annular via including two side walls extending the depth of the via, and wherein depositing the first patterned electrode deposits the first patterned electrode on a radially inward one of the two side walls.

17. The method of claim 12, wherein milling the piezoelectric substrate forms the annular via including two side walls extending the depth of the via, and wherein depositing the first patterned electrode deposits the first patterned electrode on both of the two side walls.

18. The method of claim 17, wherein depositing the first patterned electrode deposits the first patterned electrode discontinuously between the two side walls.

* * * * *